United States Patent
Mohd Yusof et al.

(10) Patent No.: US 10,355,690 B2
(45) Date of Patent: Jul. 16, 2019

(54) HIGH SPEED DRIVER WITH ADAPTIVE TERMINATION IMPEDANCE

(71) Applicant: Intel Corporation, Santa Clara, CA (US)

(72) Inventors: Siti Suhaila Mohd Yusof, Sungai Pentai (MY); Amit Kumar Srivastava, Penang (MY); Lay Hock Khoo, Georgetown (MY); Chin Boon Tear, Singapore (SG)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/279,273

(22) Filed: Sep. 28, 2016

(65) Prior Publication Data

US 2018/0091148 A1  Mar. 29, 2018

(51) Int. Cl.
| | |
|---|---|
| *H03K 19/00* | (2006.01) |
| *H03K 19/003* | (2006.01) |
| *G06F 1/06* | (2006.01) |
| *G06F 1/28* | (2006.01) |

(52) U.S. Cl.
CPC ........... *H03K 19/0005* (2013.01); *G06F 1/06* (2013.01); *G06F 1/28* (2013.01); *H03K 19/00369* (2013.01)

(58) Field of Classification Search
None
See application file for complete search history.

(56) References Cited

U.S. PATENT DOCUMENTS

| | | | | |
|---|---|---|---|---|
| 5,621,335 | A | 4/1997 | Andresen | |
| 6,326,806 | B1 * | 12/2001 | Fallside | G06F 15/7867 326/38 |
| 6,639,423 | B2 * | 10/2003 | Martin | H03K 19/01759 326/30 |
| 8,446,169 | B1 * | 5/2013 | Marlett | H04L 25/0278 326/30 |
| 9,490,853 | B2 * | 11/2016 | Kwak | H04B 1/04 |
| 2005/0110517 | A1 | 5/2005 | Chandler et al. | |
| 2007/0159228 | A1 | 7/2007 | Nguyen | |
| 2010/0192000 | A1 * | 7/2010 | Fox | G06F 13/4086 713/340 |
| 2014/0035549 | A1 | 2/2014 | Hafizi Madjid et al. | |

FOREIGN PATENT DOCUMENTS

JP  2005217999  8/2005

OTHER PUBLICATIONS

Razavi, "The StrongARM Latch", Jun. 25, 2015, IEEE Solid-State Circuits Magazine, Spring 2015, pp. 12-17.*
International Preliminary Report on Patentability from PCT/US2017/046140 dated Apr. 11, 2019, 11 pgs.

* cited by examiner

*Primary Examiner* — Minh D A
*Assistant Examiner* — James H Cho
(74) *Attorney, Agent, or Firm* — Green, Howard, & Mughal LLP

(57) ABSTRACT

An apparatus is provided which comprises: a data sampler coupled to an output of a driver, wherein the data sampler is to sample data and to compare it with a first threshold voltage and a second threshold voltage, and wherein the data sampler is to generate an up or down indicator according to comparing the data with the first and second threshold voltages; and logic coupled to the data sampler, wherein the logic is to receive the up or down indicator and to increment or decrement a number of already DC compensated impedance legs of the driver according to the up or down indicator.

24 Claims, 8 Drawing Sheets

HIGH SPEED DRIVER WITH ADAPTIVE TERMINATION IMPEDANCE

BACKGROUND

To provide plug and play capability for a better impedance matching high speed driver which needs to cater for a wide range of platform losses, Direct Current (DC) impedance matching setting of the driver (e.g., to 45Ω) is unable to match the Alternating Current (AC) impedance variation in silicon process, package mismatch, and platform. In order to meet the eye mask for the input-output (I/O) system, pre-emphasis is generally used in the driver to boost the higher frequency components of the to-be transmitted data, and this aggravates differential data ringing at the output of the driver during transition of data from high or low logic levels. This ringing can prolong, for example till half a unit interval (UI), which causes the eye diagram margin to reduce. Sometimes this ringing peak value is so high that it causes the upper level eye-diagram to fail specification.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
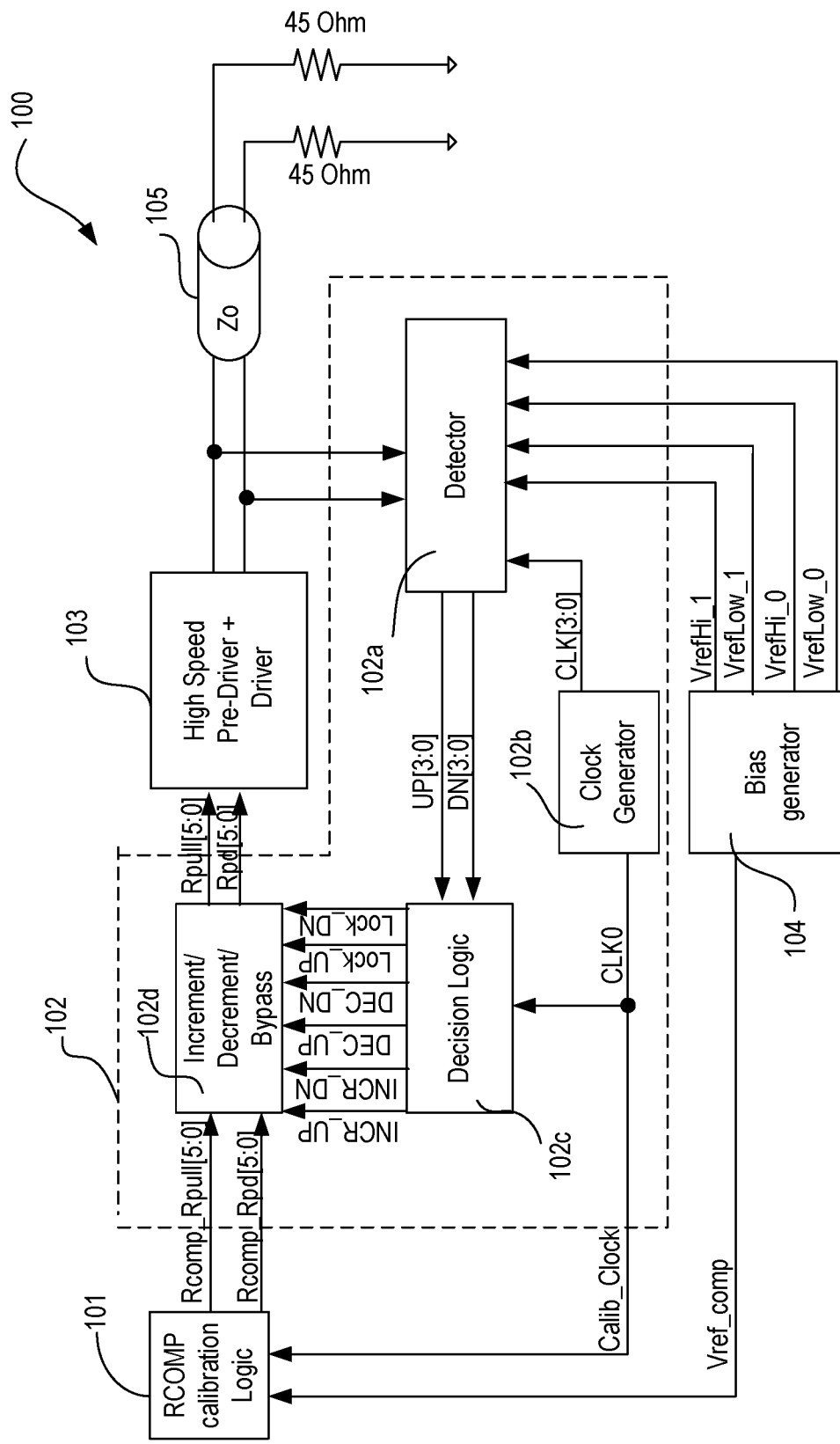
FIG. 1 illustrates a system for adaptively adjusting compensated impedance by monitoring an output of a driver, according to some embodiments of the disclosure.

Some embodiments describe an apparatus for adaptively adjusting and compensating impedance by monitoring an output of a driver. In some embodiments, digital techniques are used by the apparatus to provide a solution to mitigate ringing or to correct AC impedance mismatch induced ringing. In some embodiments, the apparatus samples data at an output of a driver using a multiphase clock during rising edge of the data and compares the data with pre-define references (e.g., VrefHi and VrefLow). In some embodiments, the compared sampled data information is stored and loaded into a decision logic. In some embodiments, the decision logic sends increment, decrement, and/or lock codes for adaptively adjusting an already compensated output impedance of the driver (e.g., pull-up and/or pull-down impedance of the driver). As such, ringing, overshoot, and/or undershoot caused by AC impedance mismatches at the output of the driver is reduced.

There are many technical effects of the various embodiments. For example, the apparatus of various embodiments provides auto correction of driver output impedance without impacting power and with minor area increment (e.g., around 1%). The apparatus of various embodiments is a digital scheme which is insensitive towards supply noise level and is scalable to other process technology nodes. The apparatus of various embodiments provides additional timing margin (e.g., by widening the data eye) which helps in catering for wider platform loss and range. The apparatus of various embodiments can be executed during a training period of the driver and as such the operation of the apparatus does not impact the functional operation of the driver. Other technical effects will be evident from the description of various embodiments and the figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% (unless otherwise specified) of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits, modules, and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure.

FIG. 1 illustrates system 100 for adaptively adjusting compensated impedance by monitoring an output of a driver, according to some embodiments of the disclosure. In some embodiments, system 100 comprises impedance calibration logic (RCOMP calibration Logic) 101, apparatus 102 for adaptively adjusting compensated impedance, driver 103 (e.g., a high speed driver with pre-driver), bias generator 104, transmission line 105, and receiver termination resistors (e.g., 45 Ohm resistors). In this example, the impedance of transmission line 105 is assumed to be 40 Ohms to 50 Ohms so as to match with the impedance of receiver termination resistors. However, other impedance values may also be used and matched with the impedances of driver 103 and the receiver. In this example, the receiver on the other side of transmission line 105 is modeled by the receiver termination resistors.

In some embodiments, impedance calibration logic 101 provides pull-up and pull-down compensated impedance codes (e.g., Rcomp_Rpull[5:0] and Rcomp_Rpd[5:0] codes, respectively) to apparatus 102. In some embodiments, pull-up and pull-down compensated impedance codes are obtained from a compensation driver that determines these codes to compensate for DC (or low frequency) based process, voltage, and temperature (PVT) variations. However, these compensated codes are not compensated for AC changes to impedance seen by driver 103. For example, when driver 103 is packaged within an integrated circuit (IC) package with impedance different than impedance of driver 103, ringing, overshoot, undershoot, etc. may be caused at the output of driver 103. In some embodiments, apparatus 102 compensates for these AC changes to impedance at the output of driver 103.

In some embodiments, apparatus 102 includes detector 102a, clock generator 102b, decision logic 102c, and increment/decrement/bypass logic 102d. In some embodiments, detector 102a is coupled to an output of driver 103. In some embodiments, detector 102a receives a multi-phase clock (e.g., a four bit clock CLK[3:0]), a first reference voltage (e.g., VrefHi_1), and a second reference voltage (e.g., VrefLow_1). In some embodiments, detector 102a senses the signal levels at the output of driver 103 using the multi-phase clock and compares it with the first and second reference voltages to generate Up and/or Down indicators (e.g., a four bit up code UP[3:0] and/or a four bit down code DN[3:0]). In some embodiments, detector 102a is imple-mented using one or more strong arm latches or clocked comparator latches. One such embodiments is described with reference to FIG. 4.

Referring back to FIG. 1, in some embodiments, clock generator 102b comprises a multi-phase signal generator (not shown) that provides a first clock (e.g., CLK0) and also generates a multi-phase clock output (e.g., a four bit clock CLK[3:0])). In some embodiments, the multi-phase signal generator (not shown) comprises a plurality of delay stages that generate the multi-phase clock output from a reference clock (not shown). In some embodiments, the plurality of delay stages comprises flip-flops coupled together in series, where the reference clock is received as data input to the first flip-flop, and a faster clock is used to sample that data for all flip-flops. Any other suitable circuit may be used for implementing the multi-phase signal generator for clock generator 102b. In some embodiments, first clock CLK0 is provided as Calib_Clock to impedance calibration logic 101.

In some embodiments, decision logic 102c is coupled to detector 102a and increment/decrement/bypass logic 102d. In some embodiments, decision logic 102c gets Up/Down indication (e.g., codes UP[3:0] and DN[3:0]) from detector 102a and generates a set of codes for increment/decrement/bypass logic 102d. In some embodiments, these set of codes include increment up (INCR_UP), increment down (INCR_DN), decrement up (DEC_UP), decrement down (DEC_DN), lock pull-up impedance code (Lock_UP) and lock pull-down impedance code (Lock_DN). In some embodiments, decision logic 102c filters the output of detector 102a.

In some embodiments, INCR_UP is generated when there is a down indicator (e.g., when DN[3:0] has at least one high bit). This is because the pull-up impedance legs are generally implemented as p-type devices, and when fewer pull-up impedance legs are requested to be turned on (e.g., in the down case), then INCR_UP bit is high. However, a person skilled in the art can modify the functional control by adding an inverter in the logic path to switch the logic such that a down indicator causes INCR_DN to be high instead of INCR_UP being high. In some embodiments, DEC_UP is generated (e.g., asserted to logic high) when there is an UP indicator (e.g., when UP[3:0] has at least one high bit). Just as the logic for generating INCR_UP can be inverted, the logic for DEC_UP can also be inverted. In some embodiments, increment/decrement/bypass logic 102d can bypass itself. In one such case, the impedance codes from RCOMP calibration Logic 101 are directly provided to Driver 103. One embodiment of a state machine generating the increment, decrement, and lock signals is described with reference to FIG. 5.

Referring back to FIG. 1, Increment/Decrement/Bypass Logic 102d receives control signals (e.g., INCR_UP, INCR_DN, DEC_UP, DEC_DN, Lock_UP, Lock_DN), and based on those control signals it adjusts the compensated pull-up impedance code (e.g., Rcomp_Rpull[5:0]) and/or compensated pull-down impedance code (e.g., Rcomp_Rpd [5:0]) and provides them as pull-up impedance code (e.g., Rpull[5:0]) and/or pull-down impedance code (e.g., Rpd[4:0]) to driver 103. In some embodiments, when Increment/Decrement/Bypass Logic 102d receives a lock signal (e.g., Lock_UP or Lock_DN), then it freezes (or locks) the pull-up and/or pull-down impedance codes.

For example, when Increment/Decrement/Bypass Logic 102d receives Lock_UP (e.g., when Lock_UP is asserted), then Rpull[5:0] is frozen for at least one clock cycle. In another example, when Increment/Decrement/Bypass Logic 102d receives Lock_DN (e.g., when Lock_DN is asserted), then Rpd[5:0] is frozen for at least one clock cycle. The locked codes are then sent to driver 103, in accordance with some embodiments. In some embodiments, pull-up and pull-down impedance codes after being locked are then provided to driver 103.

In some embodiments, bias generator 104 generates first and second reference voltages (e.g., VrefHi_1 and VrefLow_1) for Detector 102a. In some embodiments, bias generator 104 also generates bias voltage Vref_comp for RCOMP calibration logic 101. In some embodiments, first and second reference voltages (e.g., VrefHi_1 and VrefLow_1) are nearer (e.g., 20% to 5%) to logic high level of the data driven by driver 103 such that the voltage level of the first reference voltage VrefHi_1 is higher than the voltage level of the second reference voltage VrefLow_1. In some embodiments, the difference between VrefHi_1 and VrefLow_1 determines the overshoot or ringing level thresholds when the data is rising to high level or is at high level. In some embodiments, when data driven by driver 103 rises above VrefHi_1, or below VrefLow_1, then detector 102a detects a ringing or overshoot condition and generates the appropriate UP/DN codes to adjust the pull-up impedance codes (e.g., Rpull[5:0] code).

In some embodiments, bias generator 104 generates third and fourth reference voltages (e.g., VrefHi_0 and VrefLow_0) for detector 102a. In some embodiments, third and fourth reference voltages (e.g., VrefHi_0 and VrefLow_0) are nearer (20% to 5%) to logic low level of the data driven by driver 103 such that the voltage level of the third reference voltage VrefHi_0 is higher than the voltage level of the second reference voltage VrefLow_0. In some embodiments, the difference between VrefHi_0 and VrefLow_0 determines the undershoot or ringing level thresholds when the data is falling to low level or is at low level. In some embodiments, when data driven by driver 103 rises above VrefHi_0, or below VrefLow_0, then detector 102a detects a ringing or undershoot condition and generates the appropriate UP/DN codes to adjust pull-down impedance codes (e.g., Rpd[5:0] code).

Figure 2:
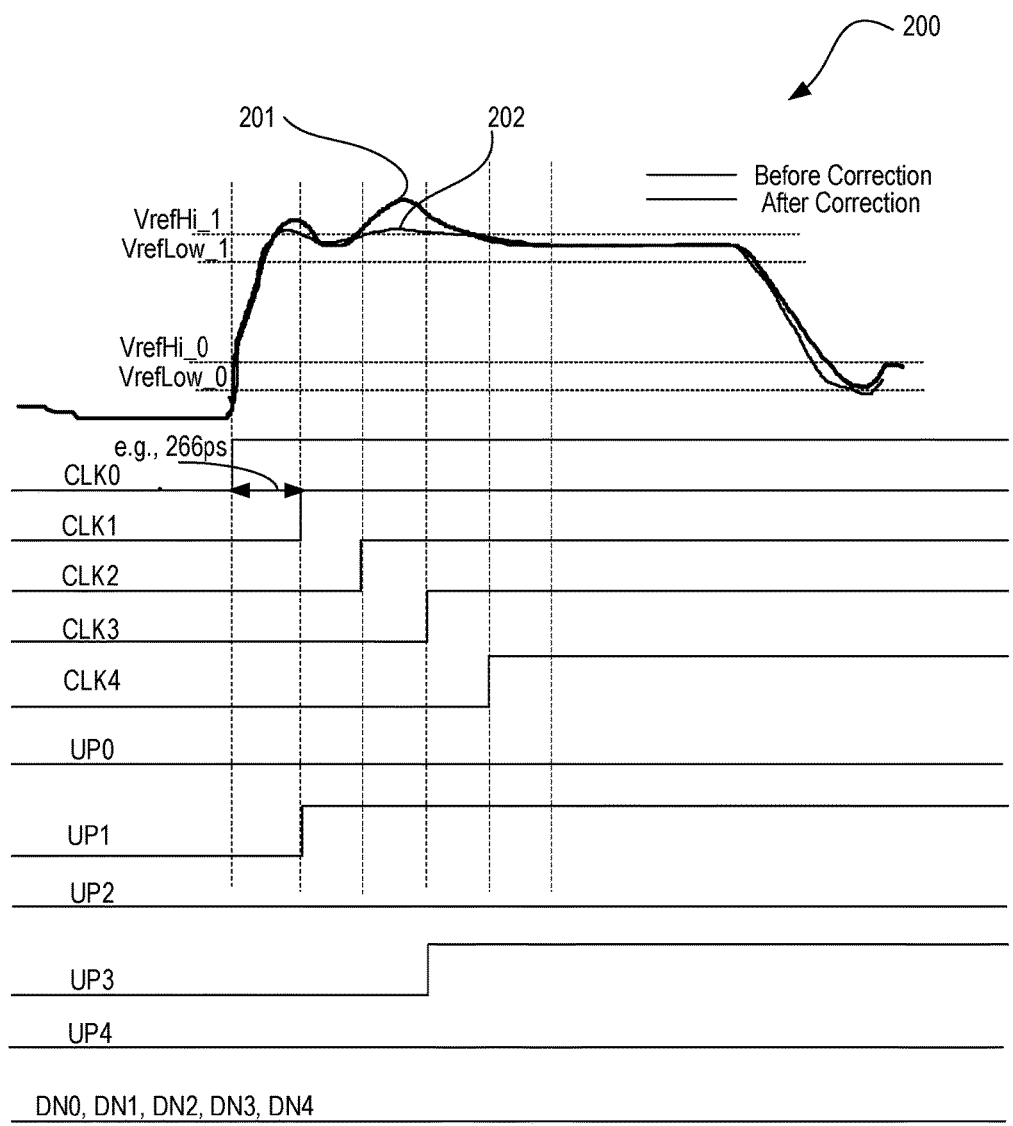
FIG. 2 illustrates a plot showing an output of the driver before and after adaptive adjustment of compensated impedance, according to some embodiments of the disclosure.

FIG. 2 illustrates plot 200 showing output of driver 103 before and after adaptive adjustment of compensated impedance, according to some embodiments of the disclosure. Here, x-axis is time and y-axis is voltage. Plot 200 shows two waveforms 201 and 202 at the output of driver 103, and control signals including multi-phase clocks CLK0, CLK1, CLK2, and CLK4, and Up/Down signals UP0, UP1, UP2, UP3, UP4, DN0, DN1, DN2, DN3, and DN4. In this example, the multi-phase signals are separated by 266 picoseconds (ps). Here, waveform 201 (gray shaded) is the output of driver 103 before adaptive adjustment of compensated impedance while waveform 202 (black) is the output of driver 103 after adaptive adjustment of compensated impedance. While waveforms 201 and 202 are superimposed on one another, waveform 202 is achieved after a clock cycle (unit interval), in accordance with some embodiments. In this case, the adjusted codes are applied at least one cycle after change in code is detected, according to some embodiments.

In some embodiments, each unit interval (UI) of the data is sampled using the multiple phase clocks and compared with first, second, third, and fourth reference voltages (VrefHi_1, VrefLow_1, VrefHi_0, and VrefLow_0, respectively). In response to comparing, Up/Down indicators are generated. In this example, overshoot or ringing is sampled at CLK1 and CLK3 edges. As such, UP1 and UP3 edges are asserted while other edges for UP (e.g., UP0 and UP4) and DN (e.g., DN0, DN1, DN2, DN3, and DN4) remain de-asserted.

Figure 3:
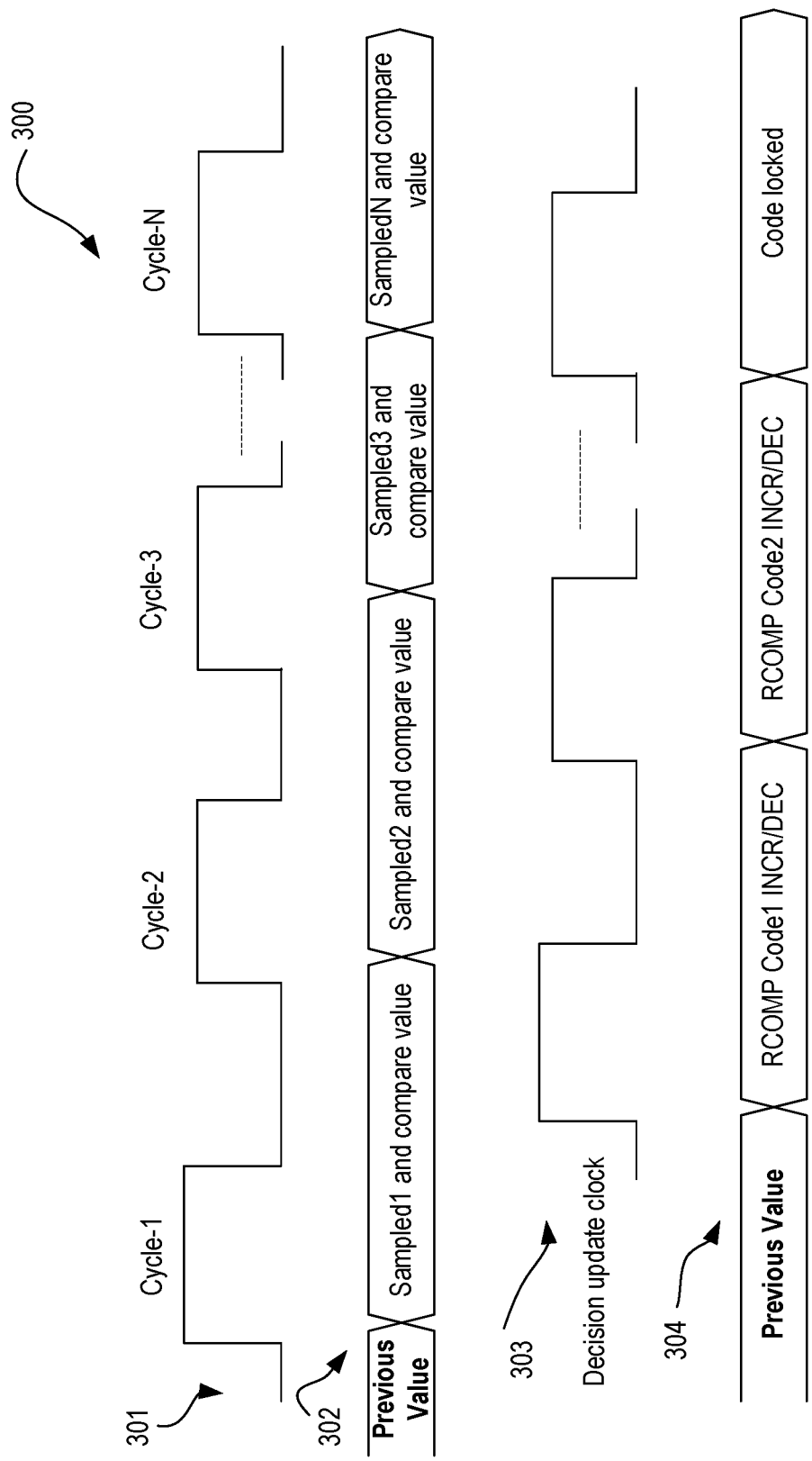
FIG. 3 illustrates a plot showing operation of the apparatus, according to some embodiments of the disclosure.

FIG. 3 illustrates plot 300 showing operation of apparatus 102, according to some embodiments of the disclosure. Plot 300 shows 'N' clock cycles (Cycle-1, Cycle-2, Cycle-3, . . . Cycle-N) 301, state 302 of detector 102a, decision update clock CLK0 (or Calib_Clock), and state 304 of Increment/Decrement/Bypass logic 102d. State 302 illustrates the sampling of data from the output of driver 103 and then comparing that data against the reference voltages. This sampling and comparing is done after every clock cycle, in accordance with some embodiments. State 303 illustrates the clock for updating states of a finite state machine (e.g., discussed with reference to FIG. 5). Referring back to FIG. 3, state 304 illustrates the various possible states of the finite state machine during the clock cycle of decision logic 102c. In some embodiments, during decision update clock 303, output of code 304 is available (e.g., increment/decrement/no change) based on the sampled and compared output. In some embodiments, after every decision update clock 303, code 304 change depends on the sampled and compared output 302.

Figure 4:
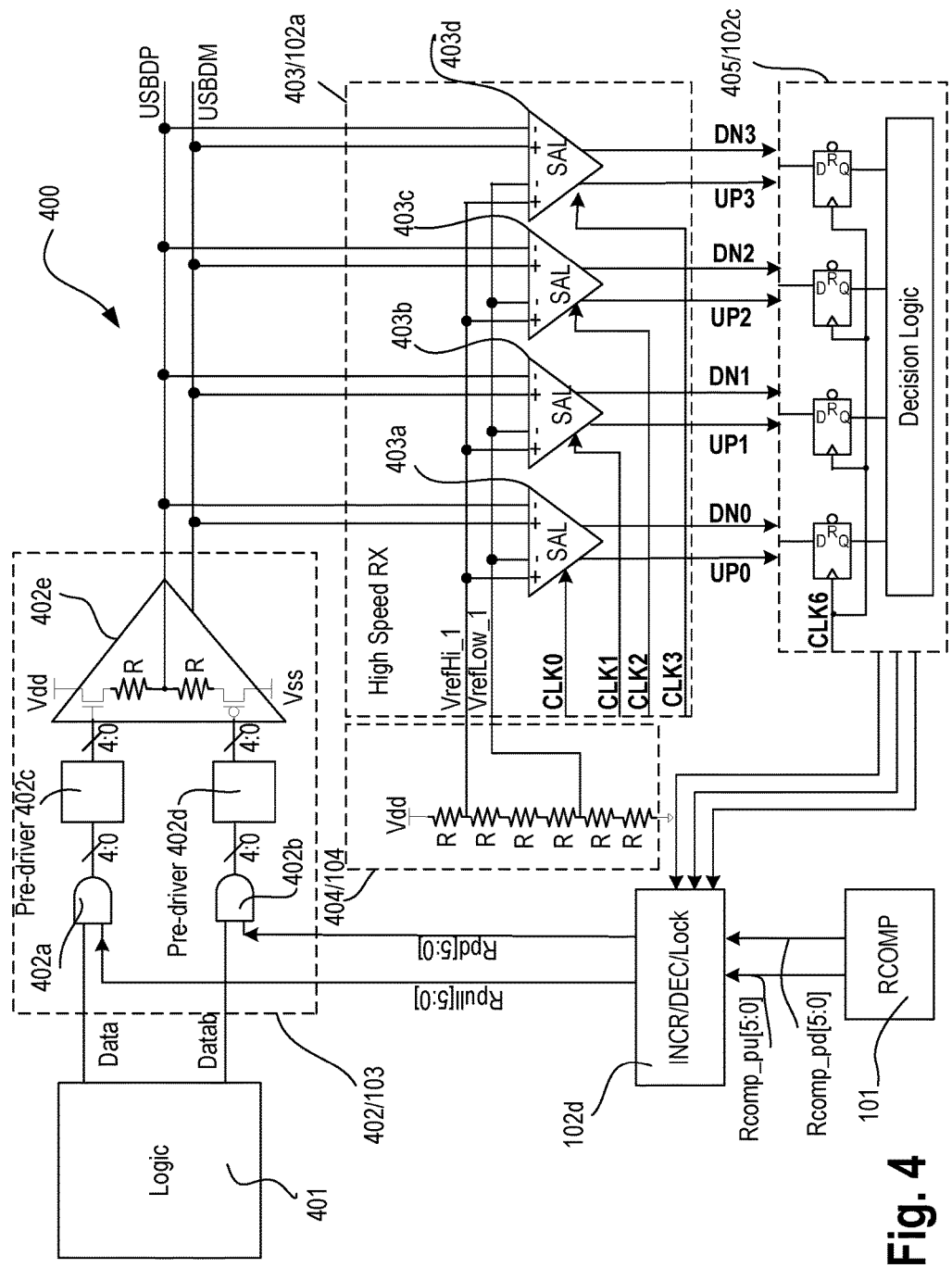
FIG. 4 illustrates an apparatus for adaptively adjusting compensated impedance by monitoring an output of a driver, according to some embodiments of the disclosure.

FIG. 4 illustrates apparatus 400 for adaptively adjusting compensated impedance by monitoring an output of a driver, according to some embodiments of the disclosure. It is pointed out that those elements of FIG. 4 having the same reference numbers (or names) as the elements of any other figure can operate or function in any manner similar to that described, but are not limited to such. Apparatus 400 includes the details of various system components of FIG. 1. Apparatus 400 comprises RCOMP logic 101, Increment/decrement/lock logic 102d, logic 401, driver 402/103, detector 403/102a, bias generator 404/104, and decision block 405/102c. In some embodiments, Logic 401 is any suitable logic providing Data and Datab (e.g., an inverse of Data).

In some embodiments, driver 402/103 comprises logic for propagating data and its associated impedance codes. In some embodiments, an AND gate 402a (or its equivalent) is provided which receives Data and the pull-up impedance codes Rpull[5:0] and provides an output for pre-driver 402c. In some embodiments, an AND gate 402b (or its equivalent) is provided which receives Datab and the pull-down impedance codes Rpd[5:0] and provides an output for pre-driver 402d. Pre-drivers 402c/d can be implemented with any suitable pre-driver design. In this example, the inputs and outputs of pre-drivers 402c/d are a five-bit bus. In some embodiments, driver 402e comprises pull-up and pull-down drivers coupled between supply nodes Vdd (e.g., power) and Vss (e.g., ground). In some embodiments, driver 402e is a Universal Serial Bus (USB) compliant driver. The output of driver 402e are USBDP and USBDM. Here, reference to node names and signal names are interchangeably used. For example, clock "CLK0" may refer to node CLK0 or clock signal CLK0 depending on the context of the sentence.

In some embodiments, detector 403/102a comprises a plurality of comparator latches (e.g., Strong Arm Latches (SAL), clocked comparators, etc.) that are coupled to the outputs USBDP and USBDM, and to reference voltages VrefHi_1 and VrefLow_1. So as not to obscure the embodiments, reference voltages for detecting overshoot/ringing when data on nodes USBDP and USBDM rises to a high level are disclosed. Reference voltages for detecting undershoot/ringing when data on nodes USBDP and USBDM falls to a low level can also be added to another set of comparator latches (not shown). In some embodiments, detector 403/102a is part of a high speed receiver (RX).

In some embodiments, comparator latch 403a receives inputs USBDP and USBDM and compares them with reference voltages VrefHi_1 and VrefLow_1 and samples inputs USBDP and USBDM using clock CLK0. The sampled output of comparator latch 403a are UP0 and DN0 which are provided to logic 405/102c, in accordance with some embodiments. In some embodiments, comparator latch 403b receives inputs USBDP and USBDM and compares them with reference voltages VrefHi_1 and VrefLow_1 and samples inputs USBDP and USBDM using clock CLK1. The sampled output of comparator latch 403b are UP1 and DN1 which are provided to logic 405/102c, in accordance with some embodiments. In some embodiments, comparator latch 403c receives inputs USBDP and USBDM and compares them with reference voltages VrefHi_1 and VrefLow_1 and samples inputs USBDP and USBDM using clock CLK2. The sampled output of comparator latch 403c are UP2 and DN2 which are provided to logic 405/102c, in accordance with some embodiments. In some embodiments, comparator latch 403d receives inputs USBDP and USBDM and compares them with reference voltages VrefHi_1 and VrefLow_1 and samples inputs USBDP and USBDM using clock CLK3. The sampled output of comparator latch 403d are UP3 and DN3 which are provided to logic 405/102c, in accordance with some embodiments.

While the embodiments illustrate four comparator latches that sample and compare data using four multi-phase clocks, other number of comparator latches and multi-phase clocks may be used for sampling and comparing data against reference voltages to achieve a desired level of AC impedance calibration.

In some embodiments, bias generator 404/104 is implemented as a voltage divider (e.g., using a resistor ladder). In other embodiments, other suitable implementations for bias generator 404/104 may be used. In some embodiments, bias generator 404/104 is shared with detector 403/102a and RCOMP 101. In some embodiments, different bias generators are used for detector 403/102a and RCOMP 101.

Figure 5:
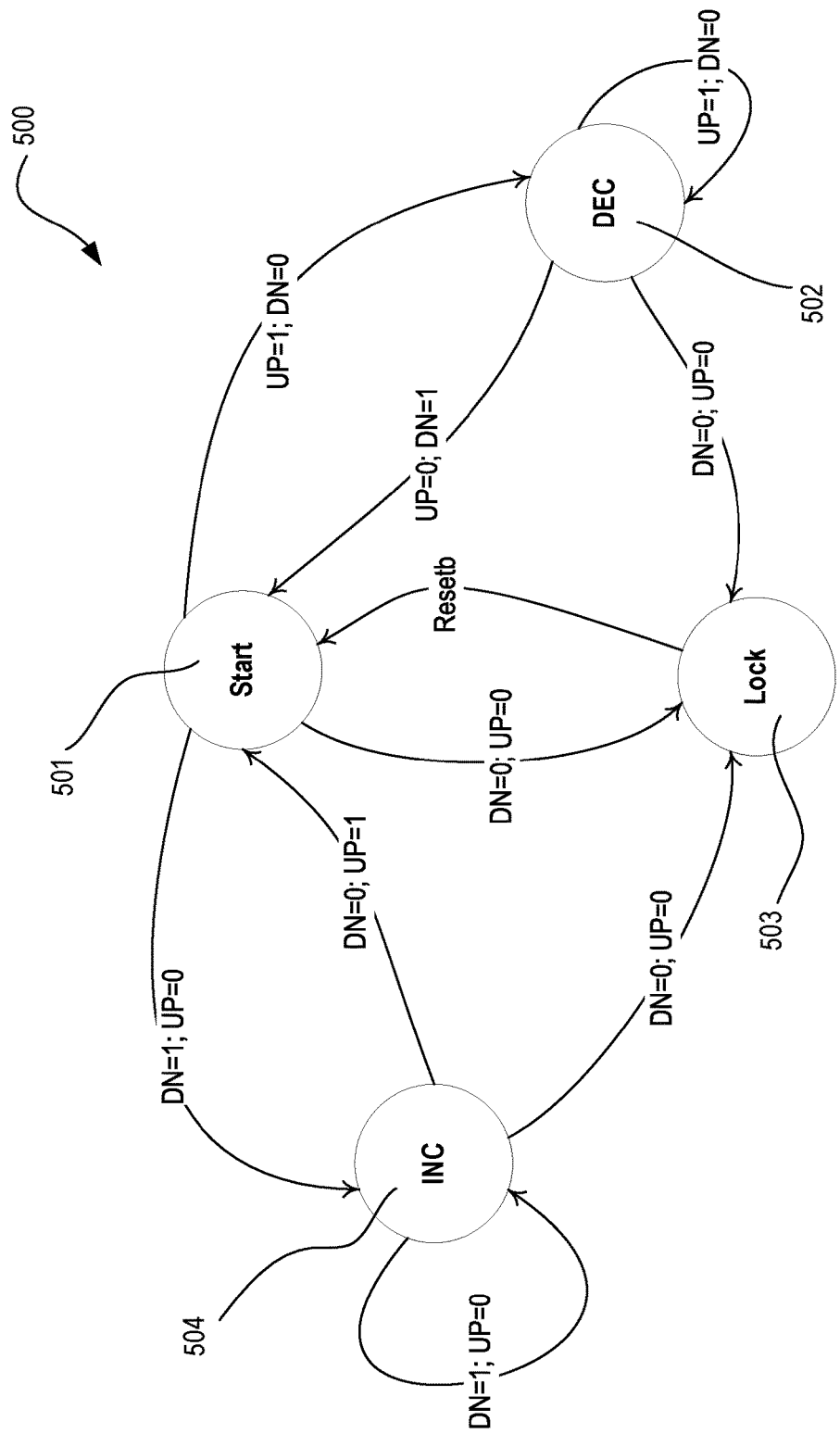
FIG. 5 illustrates a finite state machine (FSM) for adaptively adjusting compensated impedance by monitoring an output of a driver, according to some embodiments of the disclosure.

In some embodiments, logic 405/102c comprises a plurality of sequential logics (e.g., flip-flops) that sample Up and Down signals (e.g., UP0, DN0, UP1, DN1, UP2, DN2, and UP3 and DN3). One purpose of the plurality of sequential logics is to filter any possible noise in the Up and Down signals before impedance codes are adjusted by decision logic 102c and Increment/Decrement/Lock logic 102d. FIG. 5 illustrates one possible decision making process for generating impedance codes.

FIG. 5 illustrates a finite state machine (FSM) 500 for adaptively adjusting compensated impedance by monitoring an output of a driver, according to some embodiments of the disclosure. It is pointed out that those elements of FIG. 5 having the same reference numbers (or names) as the elements of any other figure can operate or function in any manner similar to that described, but are not limited to such. In this example, a four state FSM is illustrated. In other embodiments, more states can be added to enhance the capability of FSM 500. These four states are the Start state 501, Decrement (DEC) state 502, Lock state 503, and Increment (INC) state 504.

In some embodiments, FSM 500 starts at the Start state 501. When detector 102a indicates an up or a down case (e.g., when UP=1, DN=0, or when UP=0, DN=1) then FSM 500 moves to one of the DEC state 502 or INC state 504 in the next clock cycle. FSM 500 remains in that state so long as the indicators of up and down signals are the same. For example, when UP=1 and DN=0, and FSM 500 is in DEC state 502, then FSM 500 remains in DEC state 502. Likewise, when UP=0 and DN=1, and FSM 500 is in INC state 504, then FSM 500 remains in INC state 504.

In some embodiments, when FSM 500 is the DEC state 502 and the state of up and down indicators changes such that one of the indicators is in an asserted state, then FSM 500 moves back to the Start state 501. For example, when UP changes from 1 to 0, and DN changes from 0 to 1 while FSM 500 is in the DEC state 502, then FSM 500 moves to Start state 501. In some embodiments, when FSM 500 is the INC state 504 and the state of up and down indicators changes such that one of the indicators is in an asserted state, then FSM 500 moves back to the Start state 501. For example, when UP changes from 0 to 1, and DN changes from 1 to 0 while FSM 500 is in the INC state 504, then FSM 500 moves to Start state 501.

In some embodiments, when FSM 500 is in one of the Start state 501, DEC state 502, or INC state 504, and up/down indicators become zero (e.g., indicating that that further changes to the impedance codes is not needed), then FSM 500 moves to the Lock state 503. In this state, the impedance codes (e.g., Rpull[5:0] and Rpd[5:0]) are locked or frozen till Resetb is asserted. For example, when in Lock state 503 and Resetb is asserted, FSM moves from Lock state 503 to Start state 501.

FSM 500 generates increment and decrement codes to cater for AC impedance mismatch, in accordance with some embodiments. In some embodiments, FSM 500 increments or decrements by one code per clock cycle to cater impedance mismatch. Finding the correct codes continues till the time UP/DN indication goes to 00, in accordance with some embodiments. In some embodiments, the locked impedance codes are used for actual data transmission. In some embodiments, FSM 500 operates during a training Sequence (e.g., sequence 101010) of Data. In some embodiments, once the impedance codes are locked, those codes are used during actual data transmission. A person skilled in the art would appreciate that the state machine logic for INC and DEC logic may change if the logic to implement the machine is reversed or opposite polarity control signals (Up and Down) are used. In some cases, logic for UP/DN may change too when INC and DEC logic is changed.

Figure 6:
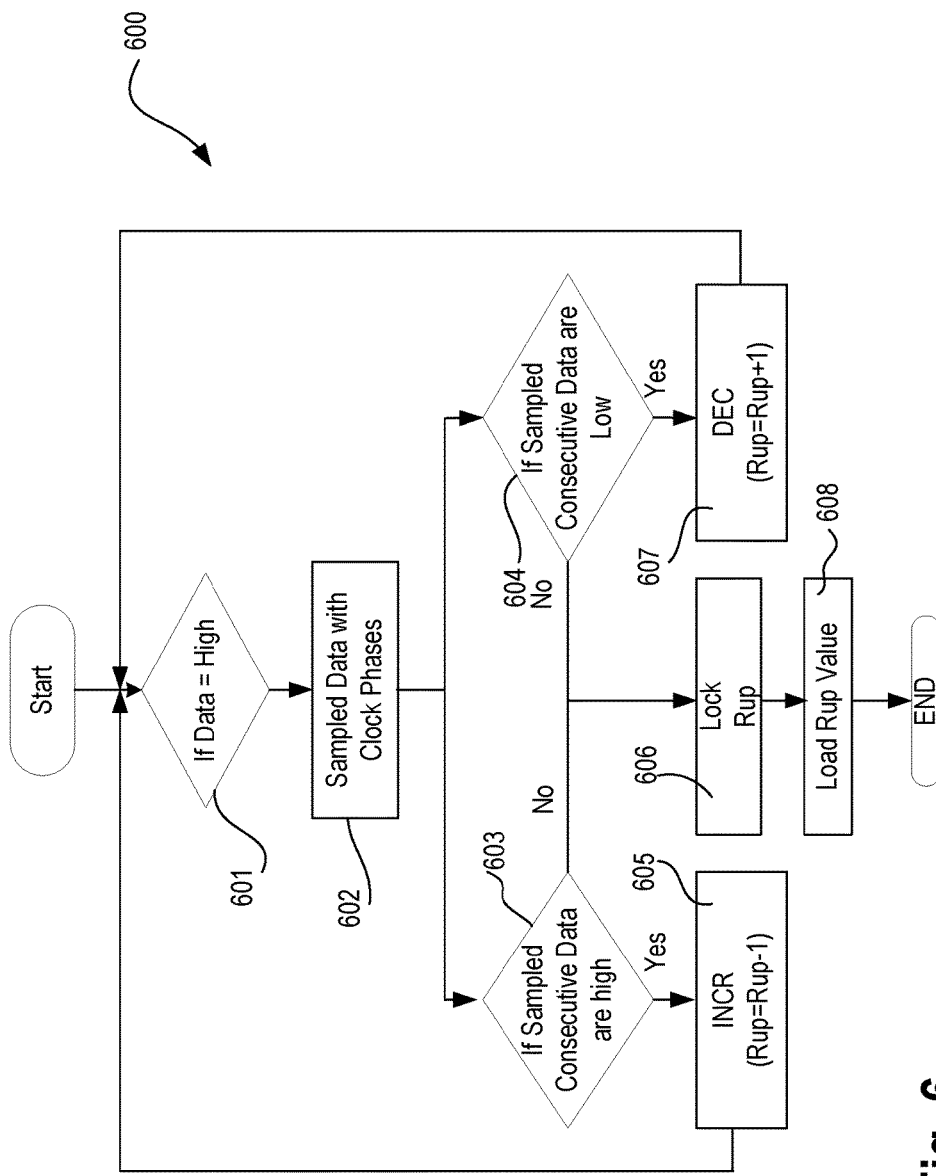
FIG. 6 illustrates a flowchart of a method for adaptively adjusting compensated pull-up impedance by monitoring an output of a driver when data is driving high, according to some embodiments of the disclosure.

FIG. 6 illustrates flowchart 600 of a method for adaptively adjusting compensated pull-up impedance by monitoring an output of a driver when data is driving high, according to some embodiments of the disclosure. It is pointed out that those elements of FIG. 6 having the same reference numbers (or names) as the elements of any other figure can operate or function in any manner similar to that described, but are not limited to such.

Flowchart 600 begins at the "Start" block and then moves to block 601. At block 601, a determination is made whether data on the output of driver 103 is High or Low. If the Data is High, then the process proceeds to block 602, otherwise the process proceeds to block 702 as described with reference to FIG. 7. Referring back to FIG. 6, at block 602, detector 102a samples data using multi-phase clock signals and compares it with the reference voltages VrefHi_1 and VrefLow_1. The output of this block are Up and Down indicators associated with overshoot/ringing.

At block 603, a determination is made whether consecutive Up and Down data are high. One reason for checking consecutive Up and Down data (generated by detector 102a) is to filter any noise on the Up and Down data before impedance codes are adjusted. If a determination is made that consecutive sampled data is high (e.g., an overshoot condition is indeed captured) then pull-up impedance codes are incremented at block 605 (e.g., Rup=Rup−1). The process then proceeds to block 601. At block 603, if a determination is made that consecutive sampled data are not high, then the process proceeds to block 606 where pull-up impedance codes are locked (e.g., Rup is defined). The process then proceeds to block 608 where the pull-up impedance codes are loaded to driver 103 to adjust impedance code for addressing AC impedance mismatch.

At block 604, a determination is made whether consecutive Up and Down data are low. One reason for checking consecutive Up and Down data (generated by detector 102a) is to filter any noise on the Up and Down data before impedance codes are adjusted. If a determination is made that consecutive sampled data is low then pull-up impedance codes are decremented at block 607 (e.g., Rup=Rup+1). The process then proceeds to block 601. At block 604, if a determination is made that consecutive sampled data are not low, then the process proceeds to block 606 where pull-up impedance codes are locked (e.g., Rup is defined). The process then proceeds to block 608 where the pull-up impedance codes are loaded to driver 103 to adjust impedance code for addressing AC impedance mismatch.

Figure 7:
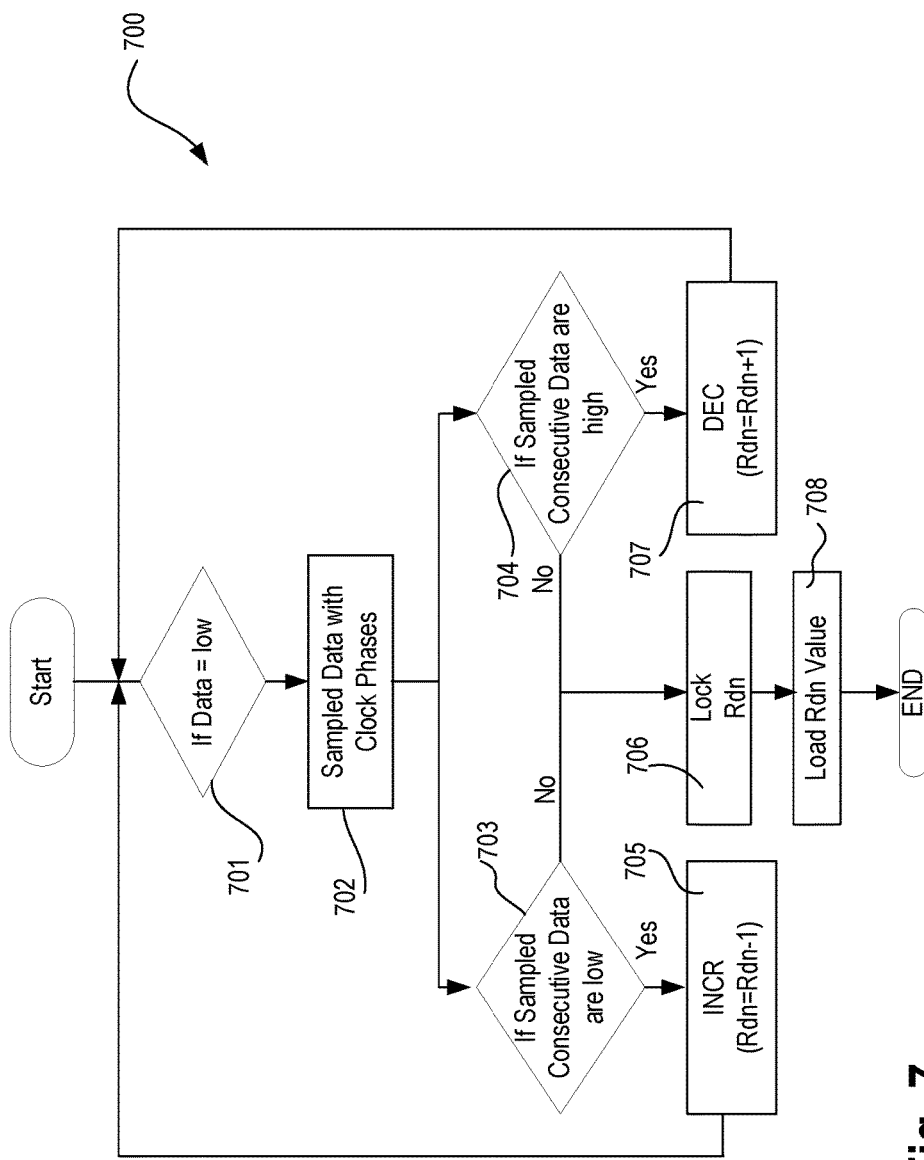
FIG. 7 illustrates a flowchart of a method for adaptively adjusting compensated pull-down impedance by monitoring an output of a driver when data is driving low, according to some embodiments of the disclosure.

FIG. 7 illustrates flowchart 700 of a method for adaptively adjusting compensated pull-down impedance by monitoring an output of a driver when data is driving low, according to some embodiments of the disclosure. It is pointed out that those elements of FIG. 7 having the same reference numbers (or names) as the elements of any other figure can operate or function in any manner similar to that described, but are not limited to such.

Flowchart 700 begins at the "Start" block and then moves to block 701. At block 701, a determination is made whether data on the output of driver 103 is High or Low. If the Data is High, then the process proceeds to block 602 of FIG. 6, otherwise the process proceeds to block 702. Referring back to FIG. 7, at block 702, detector 102a samples data using multi-phase clock signals and compares with the reference voltages VrefHi_0 and VrefLow_0. The output of this block are Up and Down indicators associated with undershoot/ringing.

At block 703, a determination is made whether consecutive Up and Down data are high. One reason for checking consecutive Up and Down data (generated by detector 102a) is to filter any noise on the Up and Down data before impedance codes are adjusted. If a determination is made that consecutive sampled data is low (e.g., an undershoot condition is indeed captured) then pull-down impedance codes are incremented at block 705 (e.g., Rdn=Rdn−1). The process then proceeds to block 701. At block 703, if a determination is made that consecutive sampled data are not high, then the process proceeds to block 706 where pull-down impedance codes are locked (e.g., Rdn is defined). The process then proceeds to block 708 where the pull-down impedance codes are loaded to driver 103 to adjust impedance code for addressing AC impedance mismatch.

At block 704, a determination is made whether consecutive Up and Down data are low. One reason for checking consecutive Up and Down data (generated by detector 102a) is to filter any noise on the Up and Down data before impedance codes are adjusted. If a determination is made that consecutive sampled data is high then pull-down impedance codes are decremented at block 707 (e.g., Rdn=Rdn+1). The process then proceeds to block 701. At block 704, if a determination is made that consecutive sampled data are not low, then the process proceeds to block 706 where pull-down impedance codes are locked (e.g., Rdn is defined). The process then proceeds to block 708 where the pull-dn impedance codes are loaded to driver 103 to adjust impedance code for addressing AC impedance mismatch.

Although the blocks in the flowchart with reference to FIGS. 6-7 are shown in a particular order, the order of the actions can be modified. Thus, the illustrated embodiments can be performed in a different order, and some actions/blocks may be performed in parallel. Some of the blocks and/or operations listed in FIGS. 6-7 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Figure 8:
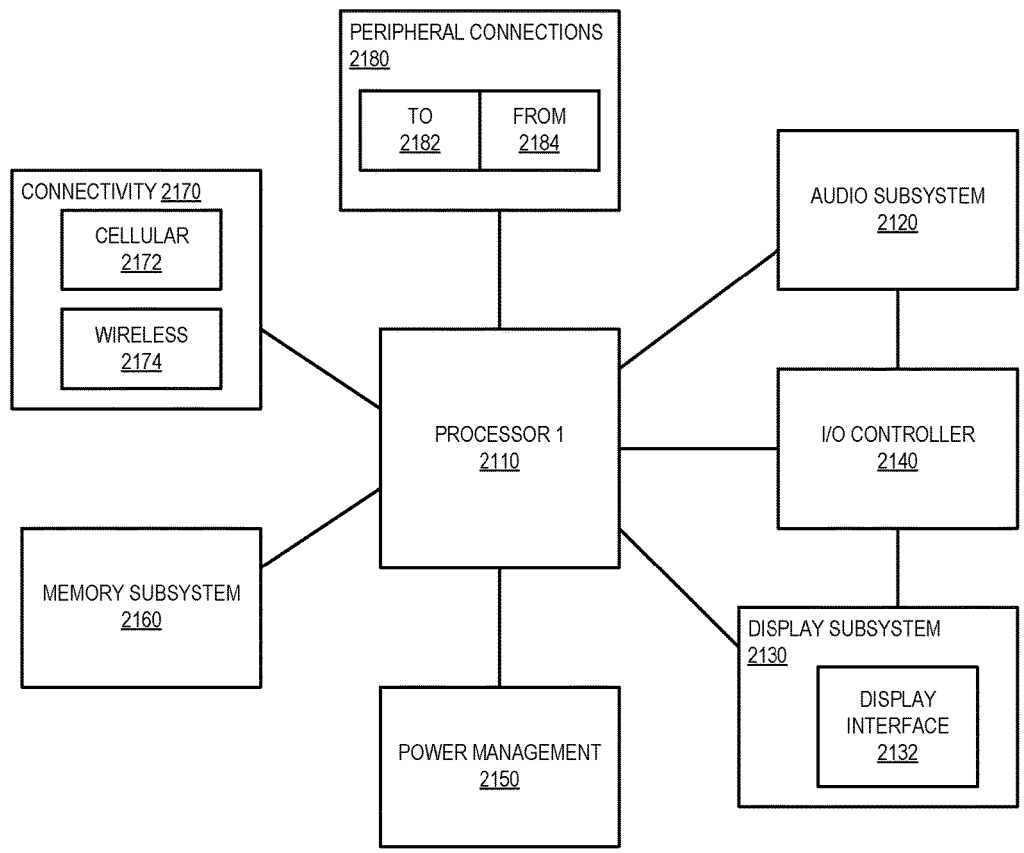
FIG. 8 illustrates a smart device or a computer system or a SoC (System-on-Chip) with an apparatus for adaptively adjusting compensated impedance by monitoring an output of a driver, according to some embodiments.

FIG. 8 illustrates a smart device or a computer system or a SoC (System-on-Chip) with an apparatus for adaptively adjusting compensated impedance by monitoring an output of a driver, according to some embodiments. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with an apparatus for adaptively adjusting compensated impedance by monitoring an output of a driver, according to some embodiments discussed. Other blocks of the computing device 2100 may also include an apparatus for adaptively adjusting compensated impedance by monitoring an output of a driver, according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, Peripheral connections 2180 include hardware interfaces and connectors, as well as software components (e.g., drivers, protocol stacks) to make peripheral connections. It will be understood that the computing device 2100 could be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a data sampler coupled to an output of a driver, wherein the data sampler is to sample data and to compare it with a first threshold voltage and a second threshold voltage, and wherein the data sampler is to generate an up or down indicator according to comparing the data with the first and second threshold voltages; and logic coupled to the data sampler, wherein the logic is to receive the up or down indicator and to increment or decrement a number of already DC compensated impedance legs of the driver according to the up or down indicator. In some embodiments, the second threshold voltage is lower than the first threshold voltage. In some embodiments, the apparatus comprises a bias generator to generate the first and second threshold voltages. In some embodiments, the first and second threshold voltages are nearer to a logic high level of the data than to a logic low level of the data. In some embodiments, the first and second threshold voltages are nearer to a logic low level of the data than to a logic high level of the data.

In some embodiments, the apparatus comprises a clock generator to provide a set of sampling clocks with different phases to the data sampler for sampling data by the set of sampling clocks. In some embodiments, the data sampler comprises a strong arm latch. In some embodiments, the up indicator is a bus having at least two bits, and wherein the down indicator is a bus having at least two bits. In some embodiments, the logic is to lock the number of already DC compensated impedance legs after the active impedance legs are incremented or decremented. In some embodiments, the driver is coupled to a transmission line. In some embodiments, the driver is a differential driver.

In another example, a system is provided which comprises: a memory; a processor coupled to the memory, the processor including an apparatus according the apparatus described above; and a wireless interface for allowing the processor to communicate with another device.

In another example, an apparatus is provided which comprises: a driver having pull-up impedance legs, wherein a number of active pull-up impedance legs is to determine a pull-up output impedance of the driver; a detector coupled to an output of the driver, wherein the detector is to sample data at the output at least two clock edges separated by a delay; and a counter coupled to the detector, wherein the counter is to receive a base number of process, voltage, and temperature (PVT) compensated active number of pull-up impedance legs, and wherein the counter is to turn on or turn off one or more pull-up impedance legs over the base number to change the number of active pull-up impedance legs according to the sampled data. In some embodiments, the data sampler is to sample the data and to compare it with a first threshold voltage and a second threshold voltage. In some embodiments, the second threshold voltage is lower than the first threshold voltage. In some embodiments, the apparatus comprises a bias generator to generate the first and second threshold voltages. In some embodiments, the first and second threshold voltages are nearer to a logic high level of the data than to a logic low level of the data. In some embodiments, the first and second threshold voltages are nearer to a logic low level of the data than to a logic high level of the data.

In another example, a system is provided which comprises: a memory; a processor coupled to the memory, the processor including an apparatus according the apparatus described above; and a wireless interface for allowing the processor to communicate with another device.

In some embodiments, a method is provided which comprises: sampling data; comparing the data with a first threshold voltage and a second threshold voltage; generating an up or down indicator according to comparing the data with the first and second threshold voltages; receiving the up or down indicator; and incrementing or decrementing a number of already DC compensated impedance legs of a driver according to the up or down indicator. In some embodiments, the second threshold voltage is lower than the first threshold voltage. In some embodiments, the method comprises generating the first and second threshold voltages. In some embodiments, the first and second threshold voltages are nearer to a logic high level of the data than to a logic low level of the data. In some embodiments, the first and second threshold voltages are nearer to a logic low level of the data than to a logic high level of the data. In some embodiments, the method comprises providing a set of sampling clocks with different phases to the data sampler for sampling data by the set of sampling clocks. In some embodiments, the up indicator is a bus having at least two bits, and wherein the down indicator is a bus having at least two bits. In some embodiments, the method comprises locking the number of already DC compensated impedance legs after the active impedance legs are incremented or decremented.

In another example, an apparatus is provided which comprises: means for sampling data; means for comparing the data with a first threshold voltage and a second threshold voltage, means for generating an up or down indicator according to comparing the data with the first and second threshold voltages; means for receiving the up or down indicator; and means for incrementing or decrementing a number of already DC compensated impedance legs of a driver according to the up or down indicator. In some embodiments, the second threshold voltage is lower than the first threshold voltage. In some embodiments, the apparatus comprises means for generating the first and second threshold voltages. In some embodiments, the first and second threshold voltages are nearer to a logic high level of the data than to a logic low level of the data. In some embodiments, the first and second threshold voltages are nearer to a logic low level of the data than to a logic high level of the data. In some embodiments, the apparatus comprises means for providing a set of sampling clocks with different phases to the data sampler for sampling data by the set of sampling clocks. In some embodiments, the up indicator is a bus having at least two bits, and wherein the down indicator is a bus having at least two bits. In some embodiments, the apparatus comprises means for locking the number of already DC compensated impedance legs after the active impedance legs are incremented or decremented.

In another example, a system is provided which comprises: a memory; a processor coupled to the memory, the processor including an apparatus according the apparatus described above; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a data sampler coupled to an output of a driver, wherein the data sampler is to sample data with a clock, and to compare it with a first threshold voltage and a second threshold voltage, wherein the data sampler is to generate an up or down indicator according to comparison of the data with the first and second threshold voltages, and wherein the data sampler comprises a strong arm latch;
   logic coupled to the data sampler, wherein the logic is to receive the up or down indicator and to increment or decrement a number of already DC compensated impedance legs of the driver according to the up or down indicator; and
   a clock generator to provide a set of clocks with different phases to the data sampler to sample the data by the set of clocks.

2. The apparatus of claim 1, wherein the second threshold voltage is lower than the first threshold voltage.

3. The apparatus of claim 1 comprises a bias generator to generate the first and second threshold voltages.

4. The apparatus of claim 1, wherein the first and second threshold voltages are nearer to a logic high level of the data than to a logic low level of the data.

5. The apparatus of claim 1, wherein the first and second threshold voltages are nearer to a logic low level of the data than to a logic high level of the data.

6. The apparatus of claim 1, wherein the up indicator is a code including at least two bits, and wherein the down indicator is a code including at least two bits.

7. The apparatus of claim 1, wherein the logic is to lock the number of already DC compensated impedance legs after active impedance legs are incremented or decremented.

8. The apparatus of claim 1, wherein the driver is coupled to a transmission line.

9. The apparatus of claim 1, wherein the driver is a differential driver.

10. An apparatus comprising:
    a driver including pull-up impedance legs, wherein a number of active pull-up impedance legs is to determine a pull-up output impedance of the driver;
    a detector coupled to an output of the driver, wherein the detector is to sample data at the output at least two clock edges separated by a delay; and
    a counter coupled to the detector, wherein the counter is to receive a base number of process, voltage, and temperature (PVT) compensated active number of pull-up impedance legs, and wherein the counter is to turn on or turn off one or more pull-up impedance legs over the base number to change the number of active pull-up impedance legs according to the sampled data.

11. The apparatus of claim 10, wherein the data sampler is to sample the data and to compare it with a first threshold voltage and a second threshold voltage.

12. The apparatus of claim 10, wherein the second threshold voltage is lower than the first threshold voltage.

13. The apparatus of claim 10 comprises a bias generator to generate the first and second threshold voltages.

14. The apparatus of claim 13, wherein the first and second threshold voltages are nearer to a logic high level of the data than to a logic low level of the data.

15. The apparatus of claim 13, wherein the first and second threshold voltages are nearer to a logic low level of the data than to a logic high level of the data.

16. A system comprising:
    a memory;
    a processor coupled to the memory, the processor including:
      a data sampler coupled to an output of a driver, wherein the data sampler is to sample data with a clock, and to compare it with a first threshold voltage and a second threshold voltage, wherein the data sampler is to generate an up or down indicator according to comparing the data with the first and second threshold voltages, and wherein the data sampler comprises a strong arm latch;
      logic coupled to the data sampler, wherein the logic is to receive the up or down indicator and to increment or decrement a number of active impedance legs of the driver according to the up or down indicator;
      a clock generator to provide a set of clocks with different phases to the data sampler to sample the data by the set of clocks; and
    a wireless interface to allow the processor to communicate with another device.

17. The system of claim 16, wherein the second threshold voltage is lower than the first threshold voltage.

18. The system of claim 16 comprises a bias generator to generate the first and second threshold voltages, wherein the first and second threshold voltages are nearer to a logic high level of the data than to a logic low level of the data, or wherein the first and second threshold voltages are nearer to a logic low level of the data than to a logic high level of the data.

19. An apparatus comprising:
    a data sampler coupled to an output of a driver, wherein the data sampler is to sample data with a clock, and to compare it with a first threshold voltage and a second threshold voltage, and wherein the data sampler is to generate an up or down indicator according to comparison of the data with the first and second threshold voltages;

logic coupled to the data sampler, wherein the logic is to receive the up or down indicator and to increment or decrement a number of already DC compensated impedance legs of the driver according to the up or down indicator; and a clock generator to provide a set of clocks with different phases to the data sampler to sample the data by the set of clocks.

20. The apparatus of claim 19 comprises a bias generator to generate the first and second threshold voltages, wherein the first and second threshold voltages are nearer to a logic high level of the data than to a logic low level of the data, or wherein the first and second threshold voltages are nearer to a logic low level of the data than to a logic high level of the data.

21. An apparatus comprising:

a data sampler coupled to an output of a driver, wherein the data sampler is to sample data with a clock, and to compare it with a first threshold voltage and a second threshold voltage, and wherein the data sampler is to generate an up or down indicator according to comparison of the data with the first and second threshold voltages; and logic coupled to the data sampler, wherein the logic is to receive the up or down indicator and to increment or decrement a number of already DC compensated impedance legs of the driver according to the up or down indicator, and wherein the first and second threshold voltages are nearer to a logic high level of the data than to a logic low level of the data.

22. The apparatus of claim 21 comprises a clock generator to provide a set of clocks with different phases to the data sampler to sample the data by the set of clocks.

23. An apparatus comprising:

a data sampler coupled to an output of a driver, wherein the data sampler is to sample data with a clock, and to compare it with a first threshold voltage and a second threshold voltage, and wherein the data sampler is to generate an up or down indicator according to comparison of the data with the first and second threshold voltages; and logic coupled to the data sampler, wherein the logic is to receive the up or down indicator and to increment or decrement a number of already DC compensated impedance legs of the driver according to the up or down indicator, and wherein the first and second threshold voltages are nearer to a logic low level of the data than to a logic high level of the data.

24. The apparatus of claim 23, comprises a clock generator to provide a set of clocks with different phases to the data sampler to sample the data by the set of clocks.

* * * * *